United States Patent [19]

Chen

[11] Patent Number: 5,734,869

[45] Date of Patent: Mar. 31, 1998

[54] HIGH SPEED LOGIC CIRCUIT SIMULATOR

[76] Inventor: Duan-Ping Chen, 1303 Peralta Ct., San Jose, Calif. 95120

[21] Appl. No.: 524,250

[22] Filed: Sep. 6, 1995

[51] Int. Cl.$^6$ .............................. G06F 9/455; G06F 15/00
[52] U.S. Cl. .................... 395/500; 364/578; 364/221.2; 364/232.3; 364/229.5; 364/DIG. 1
[58] Field of Search ................................... 395/500, 800; 364/488–491, 578

[56] References Cited

U.S. PATENT DOCUMENTS

| | | | |
|---|---|---|---|
| 5,036,473 | 7/1991 | Butts et al. | 364/489 |
| 5,282,271 | 1/1994 | Hsieh et al. | |
| 5,329,470 | 7/1994 | Sample et al. | |
| 5,428,750 | 6/1995 | Hsieh et al. | |
| 5,572,710 | 11/1996 | Asano et al. | 395/500 |
| 5,603,043 | 2/1997 | Taylor et al. | 395/800 |

OTHER PUBLICATIONS

IEEE Design & Test of Computers, Sep. 1992, Anyboard: An FPGA–Based Reconfigurable System, David E. Van Den Dout et al, pp. 21–29.
IEEE Transactions on Very Large Scale Integration (VLSI) Systems, vol. 1, No. 2, Jun. 1993, An Efficient Logic Emulation System, Joseph Varghese et al, pp. 171–174.
IEEE Transactions on Computer–Aided Design, vol. CAD–6, No. 4, Jul. 1987, HSS—A High Speed Simulator, Zeev Barzilai et al, pp. 601–616.
IEEE Transactions on Computer–Aided Design, vol. CAD–6, No. 1, Jan. 1987, Block–Level Hardware Logic Simulation Machine, Shigeru Takasaki et al, pp. 46–54.
Proceedings of the IEEE, vol. 74, No. 6, Jun. 1986, The IBM Yorktown Simulation Engine, Gregory F. Pfister, pp. 850–860.
IEEE Design & Test, Oct. 1985, HAL: A High–Speed Logic Simulation Machine, Nobuhiko Koike et al, pp. 61–73.

21st Design Automation Conference Paper 21.1, 1984 IEEE, Ultimate: A Hardware Logic Simulation Engine, M.E. Glazier and A.P. Ambler, pp. 336–342.
IEEE Design & Test, Aug. 1984, A Survey of Hardware Accelerators Used in Computer–Aided Design, Tom Blank, pp. 21–39.
IEEE Transactions on Computer–Aided Design of Integrated Circuits and Systems, vol. CAD–2, No. 2, Apr. 1983, A Logic Simulation Machine, Miron Abramovici et al, pp. 82–93.
19th Design Automation Conference Paper 7.2, 1982 IEEE, The Yorktown Simulation Engine, Monty M. Denneau, pp. 55–59.
19th Design Automation Conference Paper 7.4, 1982 IEEE, A Logic Simulation Machine, M. Abramovici et al, pp. 65–73.

*Primary Examiner*—Kevin J. Teska
*Assistant Examiner*—Ayni Mohamed
*Attorney, Agent, or Firm*—Smith-Hill and Bedell

[57] ABSTRACT

A logic circuit simulator includes a set of programmable logic devices (PLDs) having input/output terminals connected to a hold and switch (HAS) device via a parallel bus. Each PLD includes an addressable input register for receiving and storing input data conveyed on the parallel bus and an addressable output buffer for placing its output data on the parallel bus. On each pulse of an input design clock signal each PLD simulates a separate portion of the logic, producing each bit of its output data as a logical combination of bits of its stored input data. Between design clock pulses, the HAS device successively acquires output data produced by the PLDs, rearranges the PLD output data to produce new input data for each PLD, and then successively transmits the new PLD input data words to the appropriate PLDs for storage in their input registers. The process is repeated for each cycle of the design clock signal.

16 Claims, 7 Drawing Sheets

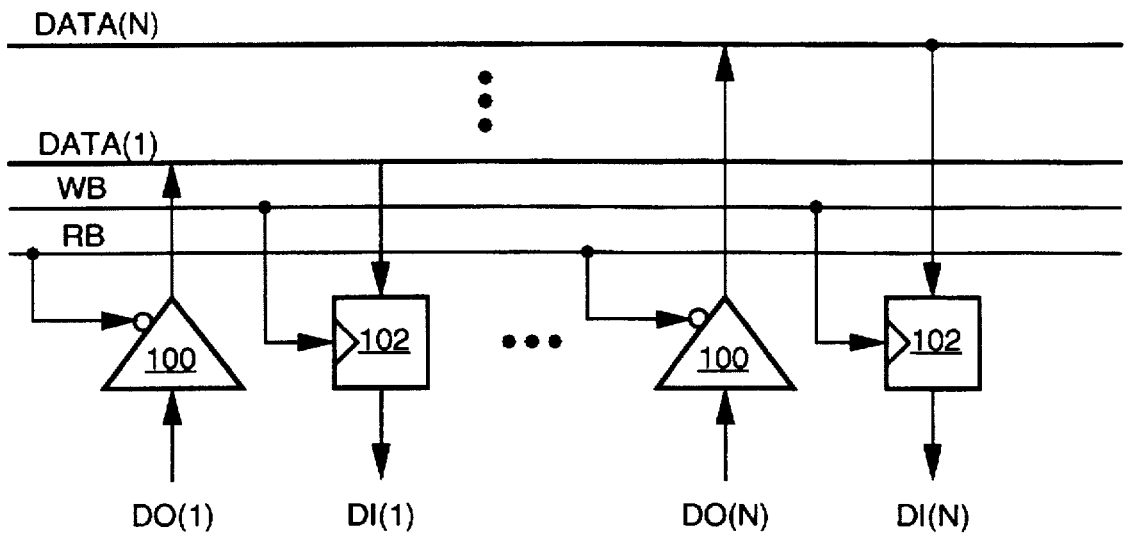
FIG. 7
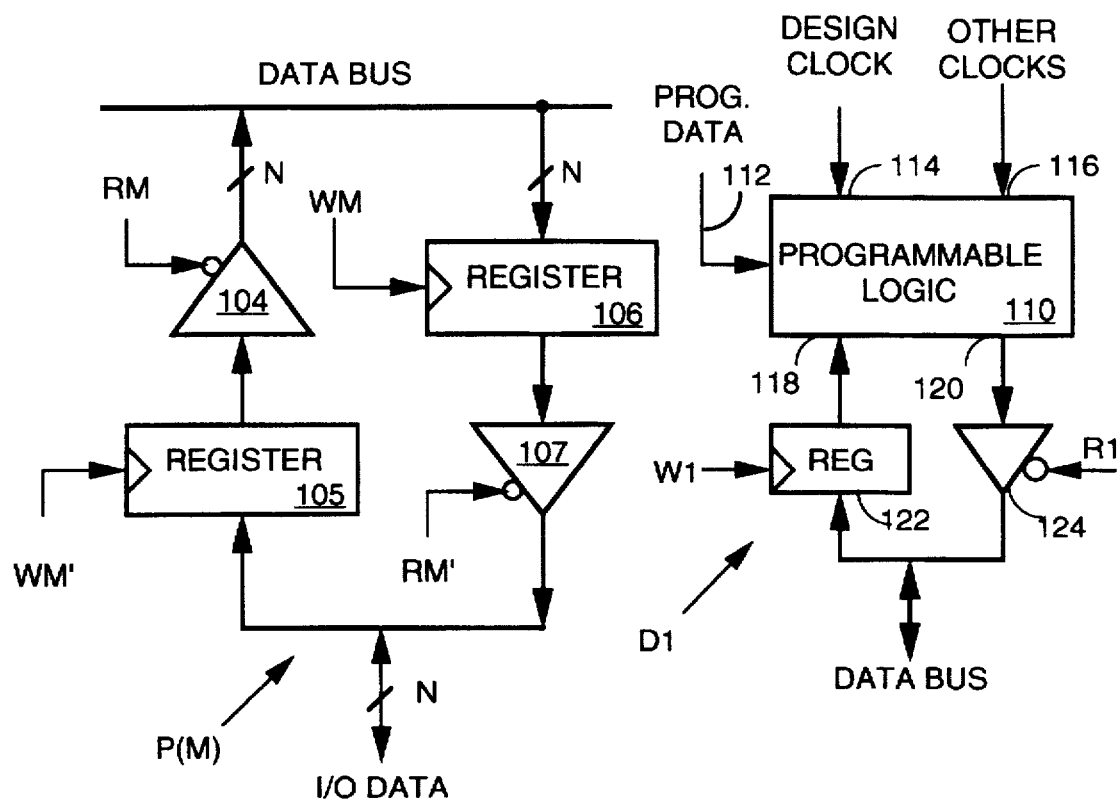
FIG. 8
FIG. 9
(PRIOR ART)

HIGH SPEED LOGIC CIRCUIT SIMULATOR

BACKGROUND OF THE INVENTION

1. Field of the Invention

The present invention relates in general to electronic logic circuit simulators and in particular to a logic circuit simulator employing programmable logic devices interconnected by a hold and switch device.

2. Description of Related Art

An integrated circuit designer typically describes an integrated circuit (IC) design using a hardware description language (HDL). A computer program converts the high level HDL description of the IC into a gate level net list description of the IC. The designer may then use an automatic place and route program to convert the net list description into a description of the mask layout. A manufacturer uses the mask layout to fabricate the IC.

Designers can use software or hardware simulators to test and verify their IC designs before fabrication. Simulators mimic the operation of the IC based on its net list or HDL description. Software simulators are inexpensive but they are slow. As IC's become larger and more complicated the time a software simulator requires to adequately test an IC design becomes prohibitive.

Hardware simulators (emulators) employ programmable logic devices such as field programmable gate arrays (FPGA's) to simulate the operation of an IC. An FPGA is an array of logic gates which can be programmed to perform various logical operations which might be performed by the IC. Hardware emulators can mimic the real time operation of an IC and can sometimes be used to emulate the IC operation in its intended operating environment. However constructing hardware emulators can be time-consuming and expensive when, as is typically the case, more than one FPGA is required to emulate the IC's logic. When more than one FPGA is needed to simulate an IC, each FPGA carries out a portion of the IC logic and the FPGA's are interconnected so that they operate together. Various programs are available to automatically partition the IC logic defined by a net list or HDL circuit description and to program the FPGA's to emulate the various IC partitions.

Interconnecting the FPGA's has been problematic. FPGA's can be mounted on a circuit board and interconnected by microstrip conductors, but the process of producing a circuit board is time consuming and expensive, and any change to the IC design requires production of a new emulator circuit board.

U.S. Pat. No. 5,329,470 entitled "Reconfigurable Hardware Emulation System", issued Jul. 12, 1994 to Stephen P. Sample et al, describes a system in which FPGA's are interconnected to form an array of interconnected FPGA's. Each FPGA's may carry out both IC logic emulation and signal routing functions. This system typically does not make very efficient use of FPGA resources and is used primarily for emulating small IC's. The size of the IC that can be emulated is limited because as the size of the FPGA array increases the proportion of each FPGA that is used for signal routing rather than emulation also increases.

U.S. Pat. No. 5,036,473 entitled "Method of Using Electronically Reconfigurable Logic Circuits", issued Jul. 30, 1991 to Michael R. Butts et al describes a system that uses a set of programmable crossbar switches to flexibly interconnect a set of FPGA's. Since connections between FPGA's can be changed by reprogramming the crossbar switches, interconnections can be quickly and easily changed. However the crossbar switches, typically arrays of pass transistors, attenuate signals as they are routed between the FPGA's. Since the paths between FPGA's and the crossbar switches further attenuate the signals, there is a practical limit to length of these paths and therefore to the size of emulator system and the size of the IC that it can emulate.

Field programmable interconnect devices (FPID's) have been used to interconnect sets of FPGA's. FPID's such as a model 160 FPID manufactured by I-CUBE, Inc. employ crossbar switches having bi-directional buffers which automatically sense signal direction at each crossbar switch port. The buffers do not require externally generated direction control signals. The buffers reduce the attenuation problem caused by unbuffered crossbar switches and allow more FPGA's to be interconnected. However this system has some disadvantages. Since the FPGA ports must be connected to separate ports of the FPIDs to provide full routing capability, a relatively large area of a printed circuit board (PCB) on which the FPGA's are mounted must be devoted to signal conductors. The space needed for the conductors limits the packing density of FPGA's on the PCB. The complicated conductor routing makes the PCB itself complicated, multilayered and expensive.

What is needed is a system for routing signals between terminals of a large number of programmable logic devices without adversely attenuating the signals while allowing efficient use of FPGA pin and logic resources.

SUMMARY OF THE INVENTION

In accordance with one aspect of the present invention, an apparatus for simulating operations of a logic circuit includes a set of programmable logic devices (PLDs) having N input/output terminals, a set of N-bit input/output (I/O) ports and a hold and switch (HAS) device, all interconnected via an N-bit parallel bus. Each PLD may be programmed to emulate a separate portion of the logic operations of the IC, performing various logic operations on an N-bit input data word to produce an N-bit output data word. The HAS device accesses the PLDS and the I/O ports via the parallel bus to route data words between the PLDs and the I/O ports so that the PLDs act together to simulate the IC.

Each PLD includes an addressable input register for receiving a PLD input data word conveyed on the parallel bus and an addressable output buffer for placing its PLD output data word on the parallel bus. On each pulse of an input design clock signal each PLD performs its portion of the logic simulation, producing each bit of its PLD output data word as a logical combination of bits of its PLD input data word stored in its input register.

Each I/O port buffers a simulator input data word from an external source onto the parallel bus and buffers a simulator output data word appearing on the bus outward to external circuits.

After each design clock pulse, the HAS device successively acquires P output data words from the PLDs and simulator input data words from the I/O ports via the bus. The HAS device then rearranges the data bits of the acquired data words to produce a new PLD input data word for each PLD and a new simulator output data word for each I/O port. The HAS device then successively transmits the new PLD input data words and simulator output data words to the appropriate PLDs and I/O ports via the bus before a next pulse of the design clock signal.

Since the PLDs and the HAS device are all interconnected in parallel by a common bus, interconnection wiring between PLDs is compact, relatively simple, and does not require multiple circuit board layers or a large amount of circuit board space. Thus PLDs can be densely packed on a printed circuit board. Also, since any PLD terminal can be used as either an input or an output terminal, PLD pin resources can be efficiently used.

In accordance with another aspect of the invention, the HAS device includes a data buffer and an array of M rows and N columns of data routing cells. M is the total number of PLDs and I/O ports and N is the number of lines in the parallel data bus or bits in the PLD input and output data words. The data buffer receives PLD output data words and I/O input data words via the parallel data bus and distributes bits thereof to the data routing cells. On each pulse of a switching clock, each routing cell responds to an internally stored microcode instruction by acquiring and storing a data bit selectively from either the data buffer or from any cell of a subset of the other routing cells. The data routing cells rearrange the PLD output and simulator input data words into new PLD input and simulator output data words by passing data bits from cell to cell such that a separate new PLD input or simulator output data word is stored in the cells along each of the N array rows. Before the next pulse of the design clock, the PLD input and simulator output data words stored in the cells along the N rows are successively delivered to the data buffer for transmission to the PLDs and I/O ports via the parallel bus.

It is accordingly an object of the invention to provide an inexpensive programmable logic circuit simulator.

It is another object of the invention to provide a system for routing data signals between hardware components which requires relatively little and relatively uncomplicated interconnection wiring.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIG. 1 illustrates a logic circuit simulator in accordance with the present invention in block diagram form, FIG. 2A is a flow chart illustrating operation of the timing and control circuit of FIG. 1, FIG. 2B is a timing diagram illustrating timing relationships between the design clock signal and the switching clock signal of FIG. 1, FIG. 3 illustrates the hold and switch device of FIG. 1 in more detailed block diagram form, FIG. 4 illustrates in block diagram form a typical routing cell of the hold and switch device of FIG. 2A, FIG. 5 illustrates the timing and control circuit of FIG. 1 in more detailed block diagram form, FIG. 6 illustrates in block diagram form a prior art state machine suitable for use as the sequencer of FIG. 5, FIG. 7 illustrates the data buffer of FIG. 3 in more detailed block diagram form, FIG. 8 illustrates a typical port of FIG. 1 in more detailed block diagram form, FIG. 9 illustrates in block diagram form a prior art field programmable gate array suitable for use as a typical programmable logic device of FIG. 1, and FIG. 10 illustrates in block diagram form a hierarchical logic circuit simulator in accordance with the present invention.

DESCRIPTION OF THE PREFERRED EMBODIMENT(S)

It is well known in the art to simulate the logic performed by an integrated circuit by partitioning the logic into a set of logic blocks, programming a set of programmable logic devices (PLDs) to simulate the logic blocks, and interconnecting the PLDs so that they can communicate with one another. The present invention relates to a logic circuit simulator employing a novel method and apparatus for flexibly interconnecting the programmable logic devices.

Simulator Architecture

Figure 1:
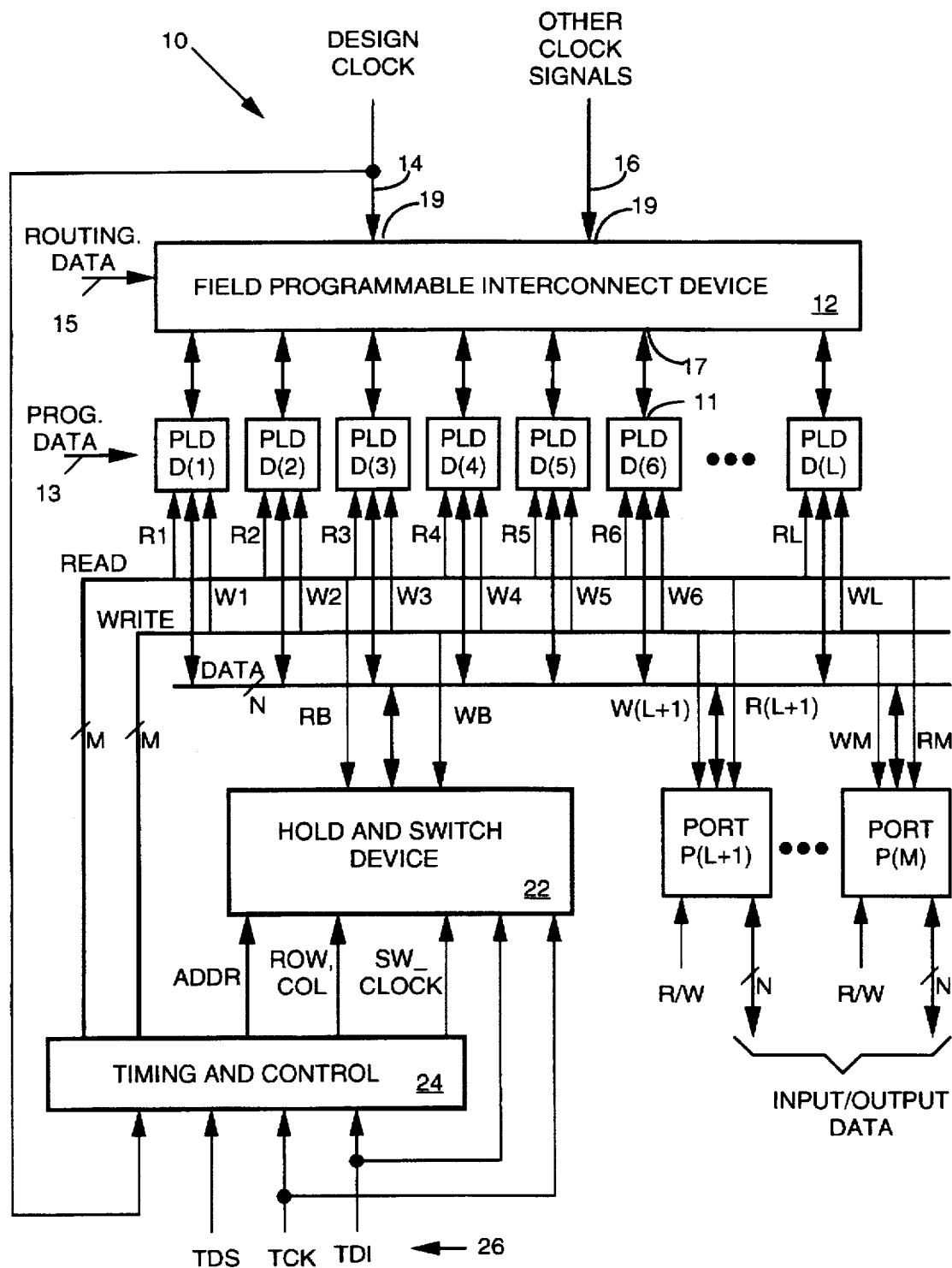

FIG. 1 illustrates in block diagram form a logic circuit simulator 10 in accordance with the present invention which may be programmed to simulate operations of a logic circuit. Simulator 10 includes a set of L programmable logic devices D(1)–D(L) mounted in sockets on a printed circuit board. Each programmable logic device (PLD) has a set of N input/output ports connected to an N-bit parallel data bus (DATA). Each PLD D(I) (where I is an integer from 1 through L) reads and stores an N- bit input data word conveyed on the DATA bus in response to a pulse on a corresponding input READ signal RI. Each PLD D(I) also places an N-bit output data word on the DATA bus in response to a pulse on a corresponding input WRITE signal WI. Microstrip conductors arranged on the circuit board form the DATA bus and convey the READ and WRITE signals to the PLDs.

In the preferred embodiment PLDs D(1)–D(L) are field programmable gate arrays (FPGA's) programmed by data conveyed by input signals 13. The structure, operation and programming of FPGA's, such as for example a XILINX model 4013, are well known to those skilled in the art. In an alternative embodiment of the invention PLDs D(1)–D(L) are programmed by external PLD programming equipment and then inserted into sockets on the circuit board.

Each PLD may be programmed to simulate a separate portion of the logic of an integrated circuit. On each pulse of a design clock signal 14 each PLD D(I) simulates its portion of logic by producing each bit of its PLD output data word as a logical combination of bits of its PLD input data word. PLDs D(1)–D(L) clock their logic operations in response to the design clock signal 14 and, when necessary, one or more other externally generated clock signals 16 or other local clock signals generated by one or more of the PLDs themselves. A field programmable interconnect device (FPID) 12 programmed by input signal routing data 15 routes the design clock signal 14 and other clock signals to, from and between additional input/output ports 11 of PLDs D(1)–D(L).

A suitable FPID is described in U.S. Pat. No. 5,282,721 entitled "I/O Buffering System to a Programmable Switching apparatus", issued Jan. 25, 1994 to Hsieh et al, incorporated herein by reference. FPID 12 includes a crossbar switch having input/output ports 17 connected to input/output ports 11 of PLDs D(1)–D(L) and other port 19 for receiving the input design clock signal 14 and other clock signals 16. FPID 12 may be programmed by externally generated routing data delivered thereto via an input bus 15 not only to route the externally generated clock signal 14 to PLDs D(1)–D(L) but also, when necessary, to route the additional clock signals 16 to the PLDs and to route local clock or other signals between the PLDs.

Simulator 10 also includes a set of M-L input/output ports P(L+1)-P(M) mounted on the circuit board and connected to the parallel DATA bus. The I/O ports transmit simulator output data to external circuits and receive simulator input data from external circuits in response to externally generated read and write control signals (R/W). Each input/output port P(J) (were J is an integer from L+1 to M) places a received simulator input data word including up to N data bits from an external source onto the DATA bus in response to a pulse on a corresponding read control line R(J). Each input/output port P(J) acquires a simulator output data word of up to N bits from the bus in response to a pulse on a corresponding write control line W(J).

A hold and switch (HAS) device 22 mounted on the circuit board also accesses the DATA bus. HAS device 22 acquires an N- bit data word appearing on the DATA bus in response to a WRITE signal WB and places an N-bit data word on the DATA bus in response to a READ signal RB. After each pulse of the design clock signal 14, the output data words produced by PLDs D(1)-D(L) and the simulator input data words stored in ports P(L+1)-P(M) are successively read onto the DATA bus and written into memory cells within the HAS device 22. In accordance with stored microcode instructions, HAS device 22 rearranges the data bits of the acquired data words to produce a new PLD input data word for each PLD and a new simulator output data word for each I/O port. Thereafter HAS device 22 successively transmits the new PLD input data words and I/O output data words over the DATA bus to the appropriate PLDs and I/O ports before a next pulse of the design clock signal 14.

A timing and control circuit 24 implemented by an integrated circuit mounted on the circuit board produces the READ and WRITE signals controlling the transfer of data between the DATA bus and PLDs D(1)-D(L), ports P(L+1)-P(M) and HAS device 22. Control circuit 24 supplies a switching clock signal SW_CLOCK and an address signal ADDR for timing and controlling data routing operations within HAS device 22. Control circuit 24 also provides a programming interface for HAS device 22, receiving instructions via a three- line control bus 26, including lines TDS, TCK and TDI, and producing in response thereto addressing (ROW and COL) and read/write (R/W) control signals for directing programming data conveyed on the TDI line into HAS 22 in a manner described below.

Timing and Control Circuit Operation

Figure 2A:
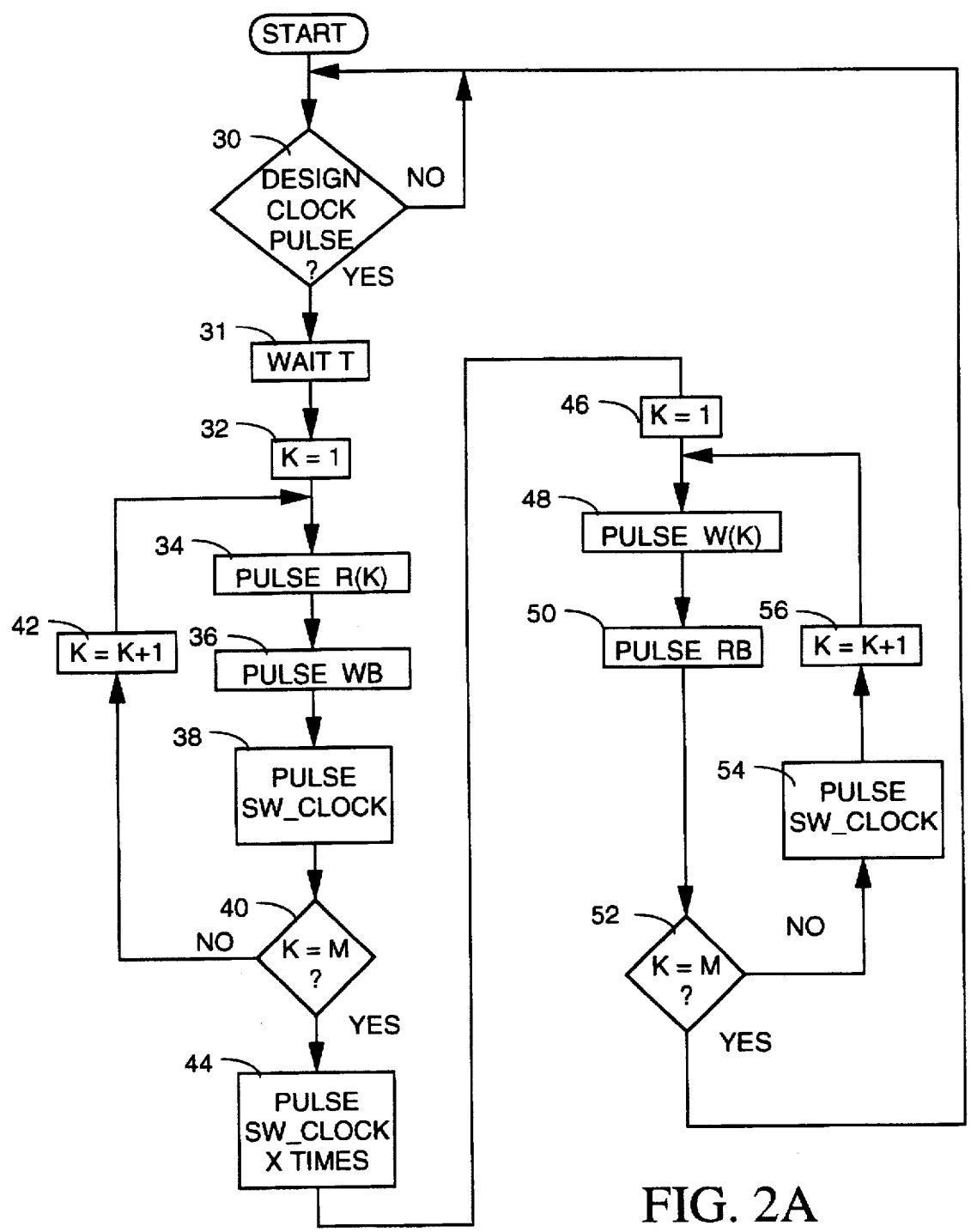

The response of timing and control circuit 24 to a pulse of the design clock signal 14 is illustrated by the flow chart of FIG. 2A. Starting at step 30, circuit 24 waits until it detects a pulse of the design clock signal. It then waits (step 31) for a time T sufficient for the PLDs to produce their output data words in response to their input data words. Then, after setting a counter K=to 1 (step 32), it pulses read control signal R(K), thereby causing PLD D(1) of FIG. 1 to place its output data word onto the DATA bus (step 34). Next it pulses the WB write signal (step 36) and the SW_CLOCK signal (step 38) thereby causing HAS device 22 to acquire the data word from PLD D(1) now on the DATA bus. If K is not equal to M (step 40), K is incremented to 2 (step 42) and steps 34, 36, 38 and 40 are repeated causing HAS device 22 to acquire the output data word of PLD D(2). Steps 34-42 are repeated until HAS device 22 has acquired M output data words, one from each PLD D(1)-D(L) and one from each port P(L+1)-P(N). At that point (step 44) timing and control circuit 24 pulses the SW_CLOCK signal a sufficient number (X) of times to cause HAS device 22 to rearrange the acquired data words from the PLDs and ports into a new input data word for each PLD and a new simulator output data word for each port. Thereafter, again setting K equal to 1 (step 46), timing and control circuit 24 pulses RB (step 50) causing HAS 18 to place the new input data word for PLD D(1) on the DATA bus and pulses W(K) causing PLD D(1) to acquire and store that data word. If K is not equal to M (step 52), timing and control circuit 24 next pulses the SW_CLOCK (step 54) causing HAS device 22 to prepare to output an input data word for PLD D(2). After incrementing K to 2 at step 56, timing and control circuit 24 repeats steps 48-52 causing HAS device 22 to transmit a new input data word to PLD D(2) via the DATA bus and causing PLD D(2) to store it. The loop formed by steps 48-56 is repeated until HAS device 22 has transmitted new input data words to all PLDs D(1)-D(L) and has transmitted new simulator output data to all ports P(L+1)-P(M). At that point (step 52), K is equal to M and timing and control circuit 24 operation returns to step 30 where it waits for a next pulse of the design clock.

Figure 2B:
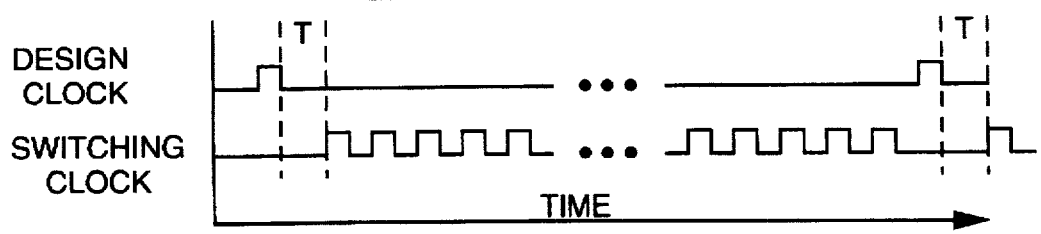

FIG. 2B is a timing diagram illustrating the relationship between pulses of the design clock signal and pulses of the switching clock signal. Switching clock signal pulses commence a time T after each pulse of the design clock and end before the next design clock pulse. The time T is the maximum time required for the PLDs to produce their output data words in response to a design clock pulse.

Since the PLDs perform their logic operations on each pulse of the design clock signal, and since HAS device 22 performs its routing operations between design clock signal pulses, the data routing operations of HAS device 22 are transparent to the PLDs. Since the PLDs and the HAS device are all interconnected in parallel to a DATA common bus, interconnection wiring between PLDs is compact and does not require multiple circuit board layers. Also, since any PLD pin can be used as either an input or an output terminal, PLD pin resources can be efficiently used.

Hold and Switch Circuit Layout

Figure 3:
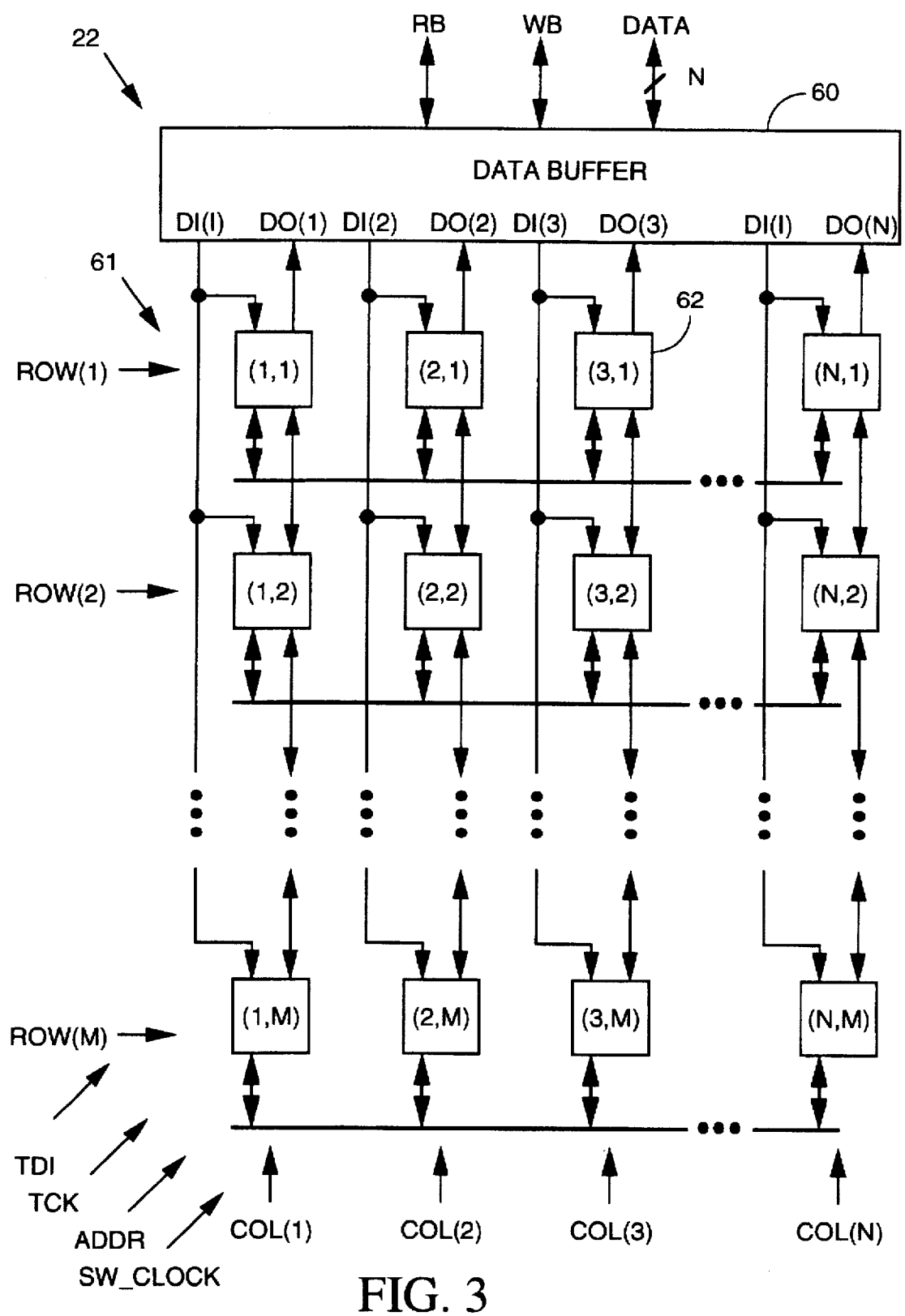

FIG. 3 illustrates HAS device 22 of FIG. 1 in more detailed block diagram form. HAS device 22 includes a bi-directional data buffer 60 and a network 61 of data cells 62 arranged to form an array of M rows and N columns. The data cells 62 are labeled (1,1) through (N,M). Data buffer 60 receives PLD output data words and simulator input data words via the DATA bus in response to the WB signal and transfers bits thereof to various data routing cells 62. The routing cells form a network wherein each routing cell 62 is connected to various other routing cells of its same row and column for transmitting data bits there between. Each routing cell of a Jth column is also connected for receiving the Jth data bit of the data word acquired by data buffer 60. On each pulse of the SW_CLOCK signal, each routing cell 62 can acquire and store a data bit selectively from either the data buffer 60 or from any cell of various other routing cells 62 to which it is connected. Each routing cell 62 is separately programmed to determine the source of the data bit acquired in response to each SW_CLOCK signal pulse.

On each of the first M SW_CLOCK clock signal pulses after a design clock signal pulse buffer 60 distributes bits of an incoming N-bit word from the DATA bus to cells 62. Thus after M SW_CLOCK signal pulses, bits all of the incoming data words from the M PLDs and ports will have been distributed to cells 62. On successive SW_CLOCK signal pulses after receiving data bits from buffer 60, cells 62 pass bits among themselves, each cell independently determining the source of its input bit on each SW_CLOCK signal pulse. The data routing cells 62 thereby rearrange the data bits received from buffer 60 into new PLD input and simulator output data words, each stored in the cells along a separate one of the M array rows. In particular, bits of a data word to be sent to a PLD D(I) or a port P(I) are stored in cells 62 of row I.

Thereafter, on each subsequent pulse of the SW_CLOCK signal, the word stored in row 1 is shifted via buffer 60 onto the DATA bus for transmission to the appropriate PLD or port, and the word stored in each remaining row I is shifted into row (I- 1). The data shifting and buffering process continues for M SW_CLOCK signal pulses so as to deliver new input data words to all PLDs and to deliver new simulator output data words to all I/O ports.

Routing Cells

Each routing cell 62 independently stores microcode program instructions indicating the actions to be taken on each pulse of the SW_CLOCK signal. The program instructions are delivered to the cell as a data sequence on a serial line TDI connected in parallel to all routing cells 62. The sequence is clocked by a clock signal TCK also connected in parallel to each cell 62. Control circuit 24 of FIG. 1 selects the particular cell 62 to receive the program instructions on the TDI line by asserting a pair of a set of row and column write control line (ROW and COL) inputs to HAS device 22. The Jth line of row control lines COL(1)–COL(N) is connected in parallel to the cells 62 of column J. The Kth line of control lines ROW(1)–ROW(M) is connected in parallel to the cells 62 of row K. When timing and control circuit 24 concurrently asserts COL(J) and ROW(K), routing cell (J,K) responds to the TCK signal by accepting the input program instructions appearing on the TDI line.

The program instructions are stored at a succession of memory addresses in random access memories (RAMs) within each routing cell 62. An address signal ADDR produced by timing and control circuit 24 of FIG. 1 is supplied in common to all routing cells 62 and provides an address input to the internal RAM within each routing cell. The data stored in the RAM of each cell (J,K) at the current ADDR address indicates the source (buffer 60 or another cell 62) from which cell (J,K) is to obtain a data bit. The timing and control circuit 24 increments ADDR on each pulse of the SW_CLOCK signal so that, depending on the data stored in the internal RAMs of cells 62, data may be delivered from one cell 62 to another either directly or via several intermediate cells during a succession of SW_CLOCK signal pulses.

The routing cells are programmed such that each routing cell (J,K) of row K at some point during the transfer of data from cell-to-cell obtains the Jth bit of the Kth output data word of HAS device 22. The Kth word is the word that is to be sent to PLD D(K) or port P(K). When cell (J,K) receives the Jth bit of the Kth word it stores it in an internal storage register. After each cell has obtained its appropriate bit, the data words stored in the storage register of cells of each row K is shifted upward to corresponding cells of row K–1 on successive pulses of the SW_CLOCK signal. Responding to the RB signal, buffer 60 buffers each successive word stored in row 1 onto the DATA bus for transmission to the appropriate PLD or port. In this fashion after M such upward row-to-row shifts, all M HAS device output data words will have been transmitted in succession to the appropriate PLDs and I/O ports. Timing and control circuit 24 of FIG. 1 thereupon ceases to pulse the SW_CLOCK signal and waits for the next design clock pulse.

Figure 4:
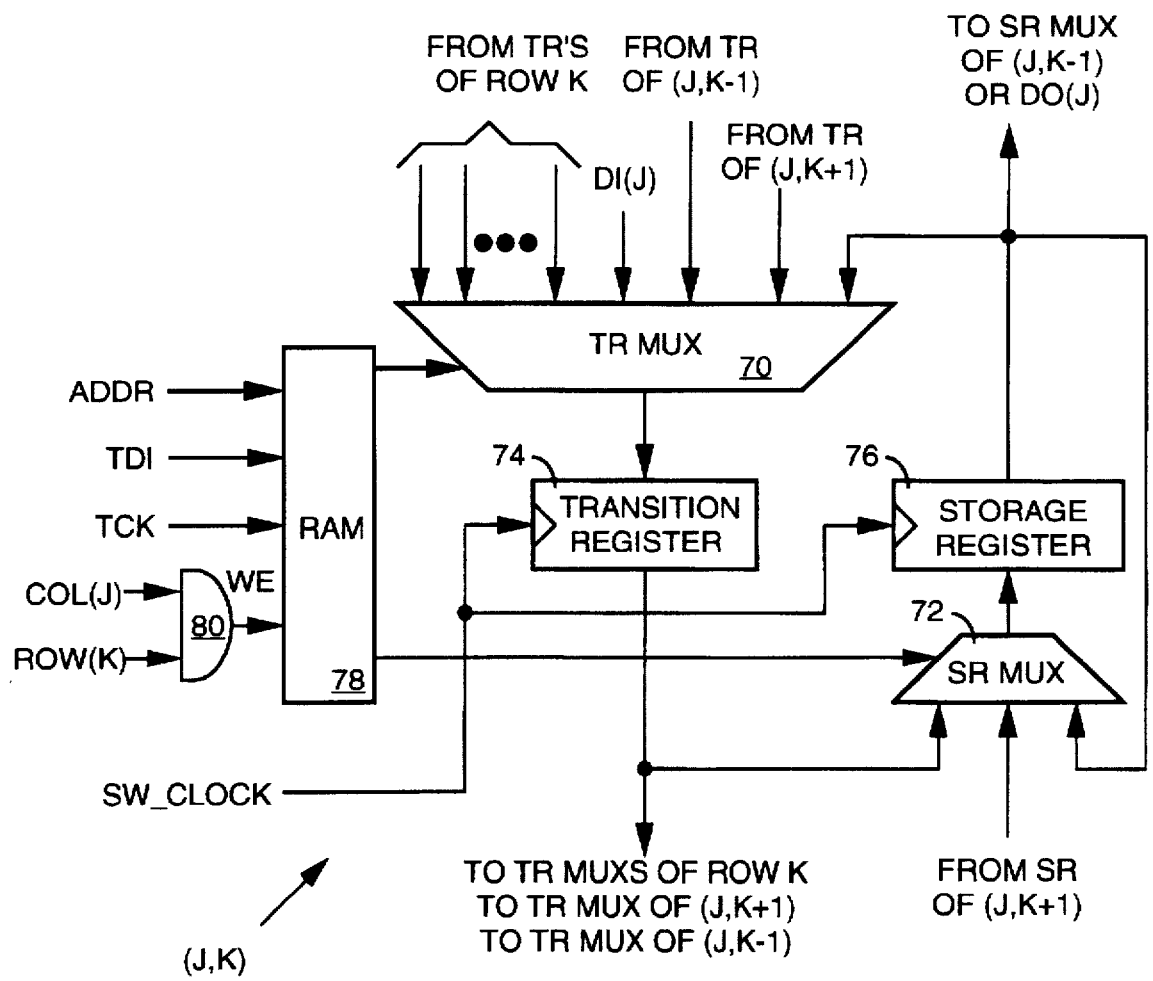

FIG. 4 depicts a typical routing cell 62, cell (J,K), of the HAS device 22 of FIG. 3. Cell (J,K) includes a pair of multiplexers 70 and 72, a pair of registers 74 and 76, a random access memory (RAM) 78, and an AND gate 80. RAM 78, read addressed by the ADDR signal from timing and control circuit 24 of FIG. 1, stores separate data at each address for controlling multiplexers 70 and 72. The ADDR address is incremented upon each pulse of the SW_CLOCK signal. As the RAM address conveyed by the ADDR is incremented, RAM 78 reads out the data stored at that address. The switching states of multiplexers 70 and 72 are set on each pulse of the SW_CLOCK signal in accordance with the data stored a successive address of RAM 78. This is how each routing cell selects the source of its input bit for each cycle of the SW_CLOCK signal.

To program cell (J,K) a data sequence delivered to RAM 78 via the serial data input line TDI is shifted into successive addresses of RAM 78 in response to a clock signal on the TCK line when a write enable signal WE is asserted. AND gate 80 asserts the write enable signal WE when the row and column write control signals ROW(K) and COL(J) are both asserted. RAM 78 stores log(X)+2 bits at each address where X is the number of multiplexer 70 inputs. Multiplexer 72 has 3 inputs and requires the two bits at each RAM 78 address.

The "transition" and "storage" registers 74 and 76 each receive and store a single data bit on each pulse of the SW_CLOCK clock signal produced by timing and control circuit 24 of FIG. 1. The transition register 74 receives its input bit from the output of transition multiplexer 70. The transition multiplexer 70 of cell (J,K) may select its output bit from several input bits including bits stored in transistor registers of other cells of row K, bits stored in the transition registers of adjacent cells in the same column (J,K–1) and (J,K+1), the Jth bit DB(J) of current output word of the data buffer 60 of FIG. 3, and the bit stored in storage register 76. Storage multiplexer 72 supplies the input to storage register 76 and can select either the output bits of registers 74 or 76, or from the output bit of the storage register of cell (J,K+1) of the neighboring row.

Referring to FIGS. 3 and 4, whenever buffer 60 is write enabled by the WB signal from timing and control circuit 24 of FIG. 1, it places each of the N bits on the DATA bus on a separate line DO(1)–DO(N). Each line DO(J) is tied to an input of the transition multiplexer 70 of each cell of column J. If bit DO(J) is to be included as the Ith bit of the Kth output word of HAS device 22, then multiplexer 70 of cell (J,K) selects DO(J) to be stored in transition register 74 on the next SW_CLOCK signal pulse. Thereafter, on successive pulses of the SW_CLOCK, that bit is transferred from cell to cell along row K until it reaches the transition register 74 of cell (I,K). Cell (I,K) then switches its multiplexer 72 to select the bit stored in transition register 74. On the next cycle multiplexer 72 selects the output of storage register 76, thereby causing the bit to remain in storage register 76 for subsequent cycles of the SW_CLOCK.

When each cell (J,K) has acquired and stored the appropriate bit in its storage register 76, the multiplexer 72 of each cell (J,K) is switched to select the bit stored in the storage register of the corresponding cell of the adjacent row (J,K+1). On next M–1 successive pulses of the SW_CLOCK, the data word in each row K is shifted upward to the next row K–1. As each data word reaches row 1, data buffer 60 is enabled by an RB pulse and the word is latched onto the DATA bus for transmission to the appropriate PLD or port.

Alternative Cell-to-Cell Connection Patterns

The operation carried out by HAS device 22 between pulses of the design clock signal requires M cycles of the SW_CLOCK signal to shift M data words into HAS device 22 from the DATA bus, a number Z of additional SW_CLOCK cycles to rearrange the data bits, and an additional M cycles of the SW_CLOCK signal to shift M new data words back onto the DATA bus. As discussed below, the value of Z depends on manner in which the individual cells are interconnected. The value of Z decreases as the connectivity between cells increases.

In one embodiment of the invention transition multiplexer 70 receives the bit stored in the transition register of every cell of row K. In such arrangement, cell (J,K) can acquire and store in the storage register a bit stored in the transition register of any other cell of row K in only one cycle of SW_CLOCK. Thus HAS device 22 requires only M cycles to write the M incoming data words into the routing cells, M cycles to shift the reformed output data onto the DATA bus, buffer and the array, and two cycles to rearrange the data along each row for a total of 2M+2 clock cycles.

However as the number N of cells in row K increases, the number of conductors needed to convey bits between cells increases rapidly. In an alternative embodiment of the invention where connections between cells of the same row are minimized, the transition multiplexer 70 of cell (J,K) receives bits from the transition registers of only its nearest neighbor cells on row K (J,K–1) and (J,K+1). In order for cell (J,K) to receive a bit from a distant cell of row K, the bit must pass through all intermediate cells on the row. For example, N–1 SW_CLOCK pulses would be required for a bit to shift from cell (1,K) to cell (N,K). In this embodiment HAS device 22 would require as many as 2M+K+S clock cycles to receive, rearrange and retransmit the data. (The additional number of cycles S needed to resolve conflicting data routing requirements is small.)

In another embodiment of the invention, the transition multiplexer 70 of cell (J,K) receives input data from the transition registers of its nearest neighbors as well as a selected grout of other cells of row K. In particular, cell (J,K) receives bits from cells of the following set: {(J+1,K), (J+2,K), (J+4,K), ..., (J+2$^{LOG(N)}$–1,K) (J–1,K) (J–2,K), (J–4,K), ..., (J–2$^{LOG(N)}$+1,K)}. For example when N is 32, cell (16,K) receives bits from cells (8,K), (12,K), (14,K), (15,K), (17,K), (18,K), (20,K), (24,K), and (32, K). In this arrangement, a bit requires a maximum of LOG(N) SW_CLOCK cycles to travel between any two cells along row K. Thus the total processing time for HAS device 22 is 2M+LOG(N)+S SW_CLOCK cycles.

Timing and Control Circuit

Figure 5:
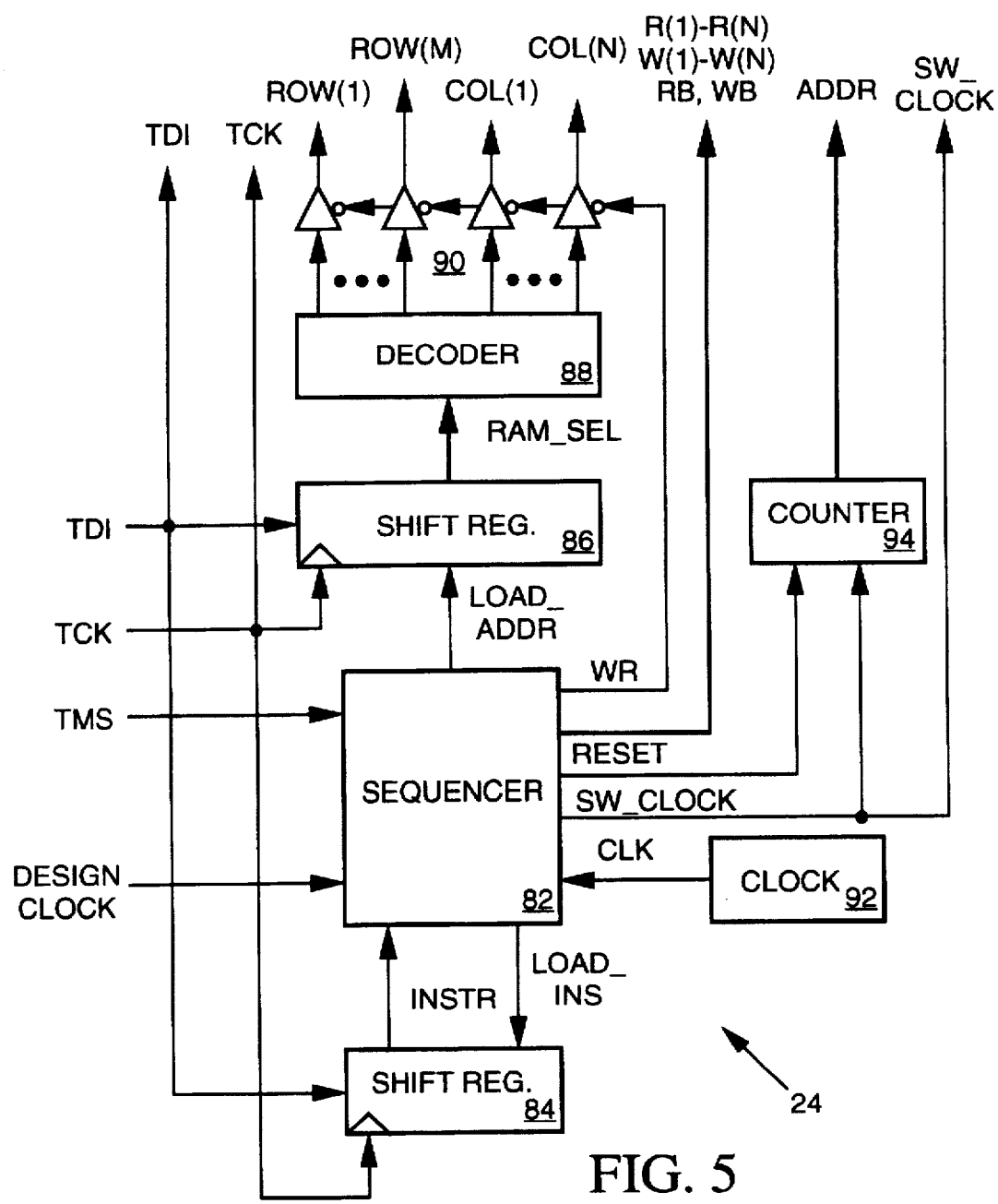

FIG. 5 illustrates timing and control circuit 24 of FIG. 1 in more detailed block diagram form. Circuit 24 includes a sequencer 82, a pair of shift registers 84 and 86, a decoder 88, a set of tristate buffers 90, a clock circuit 92 and a counter 94. When sequencer 82 receives a pulse on the TMS line of its input control bus, it input enables shift register 84 via a LOAD_INS output signal. Shift register 84, clocked by signal on the TCK line of the control bus, then shifts in a single bit instruction conveyed in serial form on the TDI line of the control bus. On a next TMS pulse sequencer 82 reads the instruction bit INSTR and performs one of two operations depending of the state of the INSTR bit. If the INSTR bit is a "0", sequencer 83 input enables shift register 86. Register 86, also clocked by the TCK line, then shifts in RAM selection data (RAM_SEL) conveyed on the TDI line. Decoder 88 decodes the RAM_SEL data to assert one of a set of M output lines ROW(1)–ROW(M) and one of a set of N output lines COL(1)–COL(N) via tristate buffers 90.

After the address data is loaded in register 86, a pulse on the TMS line tells sequencer 82 to enable buffers 90 with a WR output signal. Sequencer 82 continues to assert WR until it receives another TMS pulse indicating that the program instructions have been written into the RAM of the routing cell selected by the asserted ROW and COL lines.

When the INSTR bit stored in shift register 84 is a "1", sequencer 82 transmits a RESET signal to counter 94 to reset its count. Sequencer 82 then carries out the sequence of operations illustrated in FIG. 2A as described herein above, including pulsing the R(K), W(K), RB, WB and SW_CLOCK signals so as to cause the HAS device carry out its data routing function between SW_CLOCK pulses. Counter 94 counts SW_CLOCK pulses to produce the ADDR address supplied to the routing cell RAMS during the data routing process.

Sequencer

Figure 6:
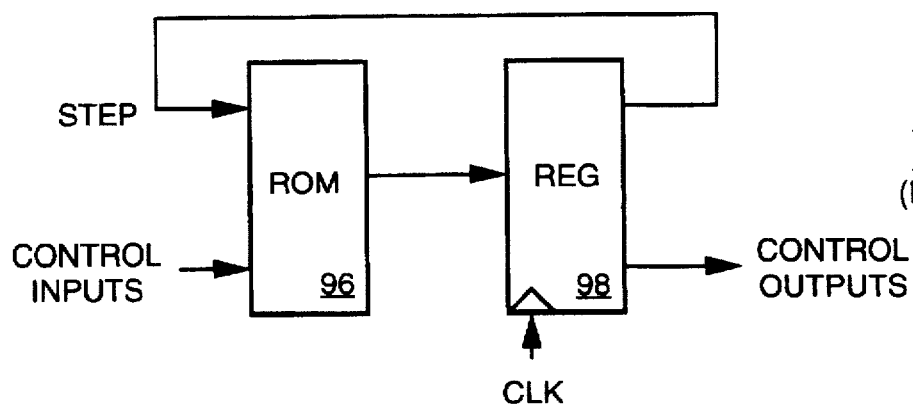

FIG. 6 illustrates a suitable prior art architecture for sequencer 94 in more detailed block diagram form. Other suitable designs that may be used to implement sequencer 94 are well-known to those skilled in the art. As shown in FIG. 6, sequencer 94 employs conventional state machine architecture including a read only memory (ROM) 96 and a register 98 clocked by the CLK signal and receiving the currently addressed output data of ROM 96. ROM 96 is addressed by the combination of a portion (STEP) of the bits stored in register 98 and sequencer control inputs including the TMS, the design clock, and the INSTR bit. In alternative embodiments of the invention ROM 96 may be replaced with a RAM write accessible through a conventional bus. When using a RAM in place of ROM 96 the values of M and X in FIG. 2A can be altered so as to maximize the efficiency of HAS device 22 for the particular number and size of PLDs and ports being interconnected.

Data Buffer

FIG. 7 illustrates data buffer 60 of FIG. 3 in more detailed block diagram form. For each line DATA(J) of the N-line DATA bus buffer 60 includes a tristate buffer 100 and a register 102. Buffer 100, controlled by the RB signal buffers signals from the DO(J) line onto the DATA(J) line and register 102, controlled by the WB signal buffers data from the DATA(J) line onto the DI(J) line.

Ports

FIG. 8 illustrates port P(M) of FIG. 1 in more detailed block diagram form. Other ports are similar. Port P(M) includes an N-bit tristate buffer 104 controlled by RM for buffering N-bit simulator input data word stored in a register 105. Register 105 stores an input data word in response to a write control signal WM' generated by external circuits. Port P(M) also includes a register 106 controlled by the WM signal for storing an N-bit data on the DATA bus. A tristate buffer 107, controlled by an externally generated read control signal RM, buffers the data onto I/O data output lines.

PLDs

FIG. 9 illustrates in block diagram form a prior art programmable logic device 108 suitable for use as PLD D(1). Other PLDs D(2)–D(L) may be similar. PLD 108 includes a block of interconnected logic gates 110 programmed by input programming data 112 having a port 114 for receiving the design clock signal, ports 116 for transmitting and receiving other clock signals, and ports 118 and 120 for receiving and transmitting N-bit input output data words. A register 122 clocked by the W1 WRITE signal receives input data from the DATA bus and delivers it to input ports 118. A tristate buffer 124 controlled by the R1 READ signal buffers output data from port 120 onto the DATA bus. XILINX model 4013 field programmable gate arrays exhibit the architecture illustrated in FIG. 9.

Hierarchical Architecture

Figure 10:
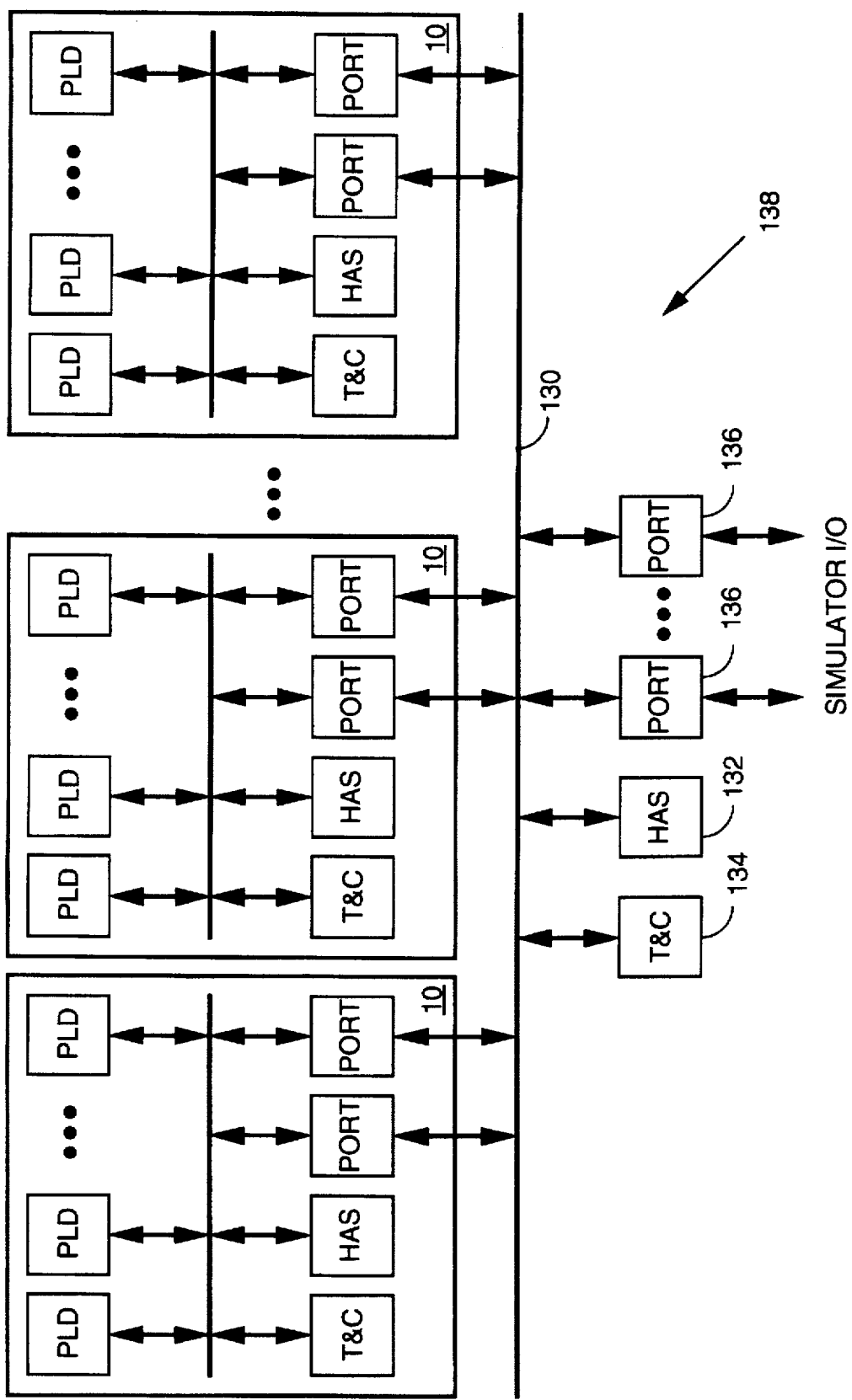

FIG. 10 illustrates an alternative embodiment of the invention in which ports of two or more simulators 10 of the type illustrated in FIG. 1 are interconnected via a bus 130 including DATA, READ and WRITE lines) to an additional HAS device 132, an additional timing and control circuit 134 and one or more ports 136 to form a larger, multiple level simulator 138. HAS device 132, timing and control circuit 134 and ports 136 are similar to HAS device 22, timing and control circuit 24 and ports P(L+1)–P(M) of FIG. 1. Hierarchical simulator 138 routes data between ports of each simulator 10 in the same manner that each simulator 10 routes data between its PLDs. For timing and control circuit 134, the time lag T illustrated in FIG. 2B between the design clock pulse and the start of the switching clock pulse must be sufficiently long for PLDs in each individual simulator 10 to produce their output words and for the HAS device in each simulator 10 to acquire, arrange, and output data to their ports. Those skilled in the art will appreciate that a three level hierarchical simulator having can be formed by interconnecting several simulators 138 in the same way two level hierarchical simulator 138 interconnects several single level simulators 10.

Thus has been described a system for simulating an integrated circuit, employing a set of programmable logic devices interconnected by a parallel bus. A hold and switch device uses the bus to acquire output data from each PLD, rearranges the PLD output data to produce PLD input data, and then transmits the input data back to the PLDs. The simulator provides complete flexibility in routing data between PLDs while requiring relatively few conductors to carry the data between PLDs. Since the few interconnecting conductors require relatively little surface area on a printed circuit board, PLDs can be packed more densely on the circuit board than in prior art systems. Thus for a given size circuit board, the system of the present invention can simulate a relatively larger integrated circuit. Also the relatively simple parallel bus interconnection between PLDs is easier and less expensive to implement than prior art interconnection systems.

While the forgoing specification has described preferred embodiment(s) of the present invention, one skilled in the art may make many modifications to the preferred embodiment without departing form the invention in its broader aspects.

The appended claims therefore are intended to cover all such modifications as fall within the true scope and spirit of the invention.

What is claimed is:

1. A data cell for a hold and switch device formed by an interconnected array of data cells, the hold and switch device receiving an input parallel data word conveyed on a bus and rearranging bits of the input parallel data word to produce an output parallel data word transmitted outward on said bus, the data cell comprising:

a first multiplexer for receiving output bits produced by other data cells of said array and a bit of said input parallel data word conveyed on said bus, and for providing a selected one of its received bits as a first multiplexer output bit;

first storage means connected for receiving and storing the first multiplexer output bit and providing its stored bit as a first cell output bit to other data cells of said array;

a second multiplexer for receiving said first cell output bit from said first storage means and receiving cell output bits produced by other data cells of said array and for providing a selected one of its received bits as a second multiplexer output bit; and second storage means connected for receiving and storing the second multiplexer output bit and providing its stored bit as a second cell output bit, said second cell output bit being provided as a bit of said output parallel data word and as an additional input bit to said second multiplexer.

2. The data cell in accordance with claim 1 further comprising control means for storing a sequence of data values, for generating and transmitting to said first and second multiplexers, respectively, first and second control signals for controlling the first and second multiplexer's selection of received bits in accordance with successive data values of said sequence.

3. An apparatus responsive to an input clock signal for receiving a succession of input data words appearing on a parallel bus, arranging bits of the input data words to form a succession of output data words and successively transmitting said output data words on said bus, the apparatus comprising:

a network of data cells for receiving said input data words, each data cell being connected to at least two other data cells, each data cell responding to said input clock signal by receiving and storing a separate bit of said input data words, each data signal thereafter responding to said clock signal by selectively acquiring data bits from the other cells to which it is connected, the network of data cells thereby arranging said input data words into said output data words, each output data word being stored by a separate group of said data cells; and means for successively receiving said input data words from said bus and conveying them to said network of data cells and for successively transmitting said output data words from said network of data cells to said bus.

4. The apparatus in accordance with claim 3 wherein one cell of said data cells comprises:

a first multiplexer for receiving data bits stored by the other data cells to which the one cell is connected and providing a selected one of the received data bits as a first multiplexer output bit;

first storage means connected for receiving and storing the first multiplexer output bit and providing the stored first multiplexer output bit as input to other cells of said network;

second storage means for receiving and storing an input second multiplexer output bit and providing the stored second multiplexer output bit as input to another cell of said network; and a second multiplexer for receiving said first multiplexer output bit stored in said first storage means, for receiving said second multiplexer output bit stored in said second storage means and for receiving a bit stored in another cell of said network, and for providing a selected one of its received bits as said second multiplexer output bit to said second storage means.

5. The apparatus in accordance with claim 4 wherein said one data cell further comprises control means for storing a sequence of data values, for generating and transmitting to said first and second multiplexers, respectively, first and second control signals for successively controlling the first and second multiplexers' selection of received bits in accordance with each successive data value of said sequence.

6. A programmable logic circuit simulator apparatus responsive to a series of clock signal pulses and input program instructions, the apparatus comprising:

a parallel bus for conveying data words;

a plurality of programmable logic devices (PLDs), each PLD being connected to said bus for receiving an input data word via said bus and for transmitting an output data word on said bus, each PLD receiving said clock signal pulses and producing its output data word on each pulse thereof, the output data word having a programmably adjustable relation to the input data word; and data routing means connected to said bus and receiving said clock signal pulses and said program instructions and, between said clock signal pulses, receiving in succession the output data words transmitted on said bus by said PLDs, arranging bits of the acquired PLD output data words according to said program instructions to produce a separate input data word for each of said PLDs, and then successively transmitting the separate PLD input data words to said PLDs via said bus.

7. The apparatus in accordance with claim 6 wherein said PLD's comprise programmable gate arrays.

8. The apparatus in accordance with claim 6 wherein said data routing means comprises:

a network of data cells, each data cell being connected to a plurality of other data cells of the network, each data cell comprising means for receiving and storing a separate portion of said program instructions, for storing a data bit, for successively acquiring data bits stored data cells to which it is connected selected in accordance with said program instructions, and for replacing its stored data bit with each successively acquired data bit, and bus interface means for successively acquiring said PLD output data words via said bus and transmitting bits of each acquired PLD output data word to the data cells of said network such that the data cells of the network, by thereafter successively acquiring data bits one from another in accordance with said program instructions, arrange the data bits into said PLD input data words stored by separate groups of said cells, said bus interface means thereupon successively transmitting PLD input data words stored by said separate groups of data cells to said PLDs via said bus.

9. The apparatus in claim 8 at least one of said data cells comprises:

memory means for receiving and storing said portion of said program instructions and for generating a control signal sequentially conveying bits of said stored program instructions;

a first multiplexer for receiving data bits stored in other cells of said network to which is connected and transmitted from said bus interface means, said multiplexer providing a selected one of its input bits as a multiplexer output bit, the one input bit being selected in response to said control signal generated by said memory means and supplied as a control input to said first multiplexer; and first storage means for periodically storing the first multiplexer output bit and for transmitting the first multiplexer output bit to other cells of said network.

10. The apparatus in accordance with claim 8 wherein said network of data cells is arranged into an array of rows and columns of data cells and wherein at least one of said data cells of one row of said rows and one column of said columns comprises:

first multiplexer means receiving a bit stored by at least one other cell of said row and successively receiving a bit of each of said output data words transmitted to said array, for producing a first output bit derived from a selected one of its received bits, first means for storing said first output bit and delivering the stored first output bit to at least one other cell of the said row, second multiplexer means receiving a bit stored in another cell of said column and receiving said first output bit stored by said first means, and a third output bit for producing a second output bit derived from a selected one of its received bits, second means for storing said second output bit and delivering the stored second output bit to another cell of said column, and for delivering said stored second output as said third output bit to said second multiplexer means;

memory means for receiving and storing said program instructions and generating first and second control signals, the first control signal being applied to said first multiplexer for controlling selection of said one of its received bits in accordance with said program instructions, the second control signal being applied to said second multiplexer for controlling selection of said one of its received bits in accordance with said program instructions.

11. An logic circuit simulator responsive to an input design clock signal conveying a series of pulses, the simulator comprising:

a bus;

a plurality of programmable logic devices (PLDs) connected in parallel to said bus, each PLD including an addressable input register for receiving and storing input data words conveyed on the parallel bus and an addressable output buffer for placing output data words on the bus, each PLD including means for receiving said input design clock signal and emulating a separate portion of said logic circuit by producing each bit of the PLD's output data word as a programmably adjustable logical combination of bits of the input data word stored in its input register in response to each pulse of said input design clock signal; and hold and switch (HAS) means connected to said bus and receiving said input design clock signal for, between pulses of said design clock signal, acquiring the output data words produced by said PLDs and placed on said bus, rearranging bits of the acquired output data words to produce new input data words for each of said PLDs, and then successively transmitting the new PLD input data words to the PLDs via said bus for storage in the PLDs' input registers.

12. The apparatus in accordance with claim 11 wherein the HAS means comprises:

a network of data cells, each data cell being connected to a plurality of other data cells of the network, each data cell comprising means for storing program instructions and a data bit, for successively acquiring selected data bits stored in the other data cells to which it is connected, acquired data bits being selected in accordance with said program instructions, each data cell replacing its stored data bit with each successively acquired data bit, and bus interface means for successively acquiring said PLD output data words via said bus and transmitting bits of each acquired PLD output data word to the data cells of said network such that the data cells of the network, by thereafter successively acquiring data bits one from another in accordance with said program instructions, arrange the data bits into said PLD input data words, said bus interface means thereupon successively transmitting PLD input data from said network to said PLDs via said bus.

13. A logic circuit simulator for receiving an externally generated simulator input data word and producing a simulator output data word in response to a series of input design clock signal pulses, the simulator comprising:

a bus;

a plurality of programmable logic devices (PLDs) connected in parallel to said bus, each PLD being connected to said bus for receiving and storing an input data word conveyed on the parallel bus and for placing an output data word on the bus, each PLD receiving said design clock signal and receiving a local clock signal, each PLD emulating a separate portion of said logic circuit by producing each bit of the PLD's output data word as a programmably adjustable logical combination of bits of the input data word in response to each pulse of said input design clock signal and in response to said local clock signal, at least one of said PLDs also generating said local clock signal;

port means, connected to said bus, for receiving said simulator input data word as input and for transmitting as output said simulator output data word;

programmable signal routing means receiving said design clock signal and interconnecting said PLDs for routing said design clock signal to said PLDs and for routing said local clock signal between said PLDs in accordance with stored routing data; and hold and switch (HAS) means connected to said bus and receiving said input design clock signal for, between pulses of said design clock signal, acquiring via said bus the output data words produced by said PLDs and said simulator input data word received by said port means, rearranging bits of the acquired data words to produce new input data words for each of said PLDs and said simulator output data word, and then successively transmitting via said bus the new PLD input data words to said PLDs and said simulator output data word to said port means.

14. The apparatus in accordance with claim 13 wherein the HAS means comprises:

a network of data cells, each data cell being connected to a plurality of other data cells of the network, each data cell comprising means for storing program instructions and a data bit, for successively acquiring selected data bits stored in the other data cells to which it is connected, acquired data bits being selected in accordance with said program instructions, each data cell replacing its stored data bit with each successively acquired data bit; and bus interface means for successively acquiring said PLD output data words via said bus and transmitting bits of each acquired PLD output data word to the data cells of said network such that the data cells of the network, by thereafter successively acquiring data bits one from another in accordance with said program instructions, arrange the data bits into said PLD input data words, said bus interface means thereupon successively transmitting PLD input data from said network to said PLDs via said bus.

15. A hierarchical logic circuit simulator for receiving an externally generated input data word and producing an output data word in response to a series of input design clock signal pulses, the simulator comprising:

a plurality of first level simulators, each first level simulator comprising a first bus; a plurality of programmable logic devices (PLDs) connected in parallel to said first bus, each PLD being connected to said first bus for receiving and storing an input data word conveyed on said first bus and for placing an output data word on the first bus, each PLD receiving said design clock signal and receiving a local clock signal, each PLD emulating a separate portion of said logic circuit by producing each bit of the PLD's output data word as a programmably adjustable logical combination of bits of the input data word in response to each pulse of said input design clock signal and in response to said local clock signal, at least one of said PLDs also generating said local clock signal; first port means, connected to said first bus, for receiving a first simulator input data word as input and for transmitting as output a first simulator output data word; programmable signal routing means receiving said design clock signal and interconnecting said PLDs for routing said design clock signal to said PLDs and for routing said local clock signal between said PLDs in accordance with stored routing data; and first hold and switch (HAS) means connected to said first bus and receiving said input design clock signal for, between pulses of said design clock signal, acquiring via said first bus the output data words produced by said PLDs and said first simulator input data word received by said first port means, rearranging bits of the acquired data words to produce new input data words for each of said PLDs and said first simulator output data word, and then successively transmitting via said first bus the new PLD input data words to said PLDs and said first simulator output data word to said first port means;

a second bus interconnecting the first port means of each of said first level simulators;

second port means, connected to said second bus, for receiving as input and placing on said second bus said input data word and receiving from said second bus and transmitting as output said output data word;

second HAS means connected to said second bus and receiving said input design clock signal for, between pulses of said design clock signal, acquiring via said second bus the first simulator output data word transmitted by first port means of each of said first level simulators and said input data word received by said second port means, rearranging bits of the acquired data words to produce new first level simulator input data words for each of said first level simulators and said output data word, and then successively transmitting via said second bus the new first level simulator input data words to the first port means of said first level simulators and said output data word to said second port means.

16. A method for conveying data between logic devices via a parallel bus, wherein each logic device receives a separate multiple-bit input data word and then responds to a pulse of an input clock signal by generating a separate multiple-bit output data word, wherein each bit of the output data word of each logic device is a logical derivation of one or more bits of the logic device's input data word, the method comprising the steps of:

a. after each pulse of said clock signal, acquiring in succession via said bus an output data word produced by said logic devices and storing each bit of each acquired output data word in a separate data cell of an array of data cells, the array including a plurality of rows of data cells, bits of each output data word being stored in data cells of a separate one of said rows;

b. routing bits of the output data words between said data cells for storage therein so as to form said input data words, each bit of each input data word being stored in a separate data cell of said array and each input data word being stored in data cells of a separate row of said array, and c. then, before a next pulse of the clock signal, transmitting in succession a separate one of said input data words to each of said logic devices via said bus.

* * * * *